(12) United States Patent
Saito (10) Patent No.: US 11,325,284 B2
(45) Date of Patent: May 10, 2022

(54) PROTECTIVE MEMBER FORMING METHOD

(71) Applicant: DISCO CORPORATION, Tokyo (JP)

(72) Inventor: Yoshinobu Saito, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/089,070

(22) Filed: Nov. 4, 2020

(65) Prior Publication Data

US 2021/0129394 A1     May 6, 2021

(30) Foreign Application Priority Data

Nov. 6, 2019    (JP) .............................. JP2019-201389

(51) Int. Cl.
| | | |
|---|---|---|
| *B29C 43/18* | (2006.01) | |
| *B29C 43/52* | (2006.01) | |
| *B29K 101/12* | (2006.01) | |
| *B29L 31/34* | (2006.01) | |

(52) U.S. Cl.
CPC .............. *B29C 43/18* (2013.01); *B29C 43/52* (2013.01); *B29K 2101/12* (2013.01); *B29L 2031/34* (2013.01)

(58) Field of Classification Search
CPC ..... B29C 43/18; B29C 43/52; B29K 2101/12; B29L 2031/34; H01L 21/67103; H01L 21/67109; H01L 21/6715; H01L 21/67253; H01L 21/6835; H01L 2221/68327
See application file for complete search history.

(56) References Cited

U.S. PATENT DOCUMENTS

| 11,133,219 B2* | 9/2021 | Priewasser .............. H01L 21/78 |
| 2017/0121552 A1* | 5/2017 | Takano .................... C09D 7/63 |

FOREIGN PATENT DOCUMENTS

JP           2017168565 A     9/2017

* cited by examiner

*Primary Examiner* — Robert J Grun
(74) *Attorney, Agent, or Firm* — Greer Burns & Crain Ltd.

(57) ABSTRACT

A protective member forming method for forming a protective member on a surface on one side of a wafer includes a resin state recognizing step of heating a thermoplastic resin in contact with the surface on the one side of the wafer while propagating an ultrasonic vibration between a resin placing surface of a stage and a wafer holding surface and recognizing whether or not the thermoplastic resin sandwiched between the surface on the one side of the wafer held on the wafer holding surface and the resin placing surface has been unified. When the thermoplastic resin is recognized to have been unified, the thermoplastic resin is spread out onto a whole area of the surface on the one side of the wafer, followed by cooling the thermoplastic resin to cure the thermoplastic resin.

1 Claim, 7 Drawing Sheets

PROTECTIVE MEMBER FORMING METHOD

BACKGROUND OF THE INVENTION

Field of the Invention

The present invention relates to a protective member forming method.

Description of the Related Art

In the technology disclosed in Japanese Patent Laid-open No. 2017-168565, a protective member is formed on a surface on one side of an as-sliced wafer by use of a resin. The wafer is held by a chuck table through the protective member, and a surface on the other side of the wafer is ground. As a result, undulation of the wafer is removed, and the thickness of the wafer is made uniform.

Formation of the protective member is carried out, for example, as follows. First, a sheet is disposed on a stage. A liquid resin is supplied onto the sheet. The liquid resin is spread by a surface on one side of the wafer. As a result, the liquid resin is spread over a whole area of the surface on the one side of the wafer. Thereafter, the liquid resin is cured.

The liquid resin is sucked up from a tank filled with the liquid resin by a pump, and is supplied onto the sheet on the stage. Since the tank of the liquid resin is heavy, an operation for replacement thereof is a burden on an operator. To cope with this problem, there is a technology of using a solid granular resin.

In this technology, the granular resin is melted into a liquid on a stage and is spread into a plate shape by a surface on one side of a wafer. The resin is cured by cooling. As a result, a plate-shaped protective member can be formed on the surface on the one side of the wafer.

SUMMARY OF THE INVENTION

In the above-mentioned protective member forming method using the solid granular resin, the resin to be melted is sandwiched between the stage and the wafer. Therefore, it is difficult to determine whether or not the solid resin has been melted. As a result, an insufficient liquid resin including the resin which has not been melted completely may be spread by the wafer. In this case, it is difficult to form a protective member uniform in thickness, and the granular resin and the time taken for liquefaction thereof may be wasteful.

It is accordingly an object of the present invention to provide a protective member forming method by which it is favorably recognized that a resin has become a liquid, in forming a protective member by converting a solid resin into a liquid.

In accordance with an aspect of the present invention, there is provided a protective member forming method for forming a protective member on a surface on one side of a wafer, the protective member forming method including a resin supplying step of disposing a plurality of granules of a thermoplastic resin on a resin placing surface of a stage, a wafer holding step of holding a surface on another side of the wafer by a wafer holding surface of a wafer holding unit, a contact step of moving the wafer holding unit and the stage relatively in a direction for approaching each other by use of a vertically moving mechanism to bring the surface on the one side of the wafer held by the wafer holding unit into contact with the granules of the thermoplastic resin, a resin state recognizing step of heating the granules of the thermoplastic resin in contact with the surface on the one side of the wafer while propagating an ultrasonic vibration between the resin placing surface and the wafer holding surface and recognizing whether or not the thermoplastic resin sandwiched between the surface on the one side of the wafer held on the wafer holding surface and the resin placing surface has been unified, a spreading-out step of spreading out the thermoplastic resin recognized to have been unified in the resin state recognizing step onto a whole area of the surface on the one side of the wafer by the wafer, and a curing step of cooling the thermoplastic resin spread out, to cure the thermoplastic resin. The protective member that protects the whole area of the surface on the one side of the wafer is formed.

In the resin state recognizing step of the protective member forming method of the present invention, it is recognized whether or not the thermoplastic resin sandwiched between a surface on one side of the wafer and the resin placing surface has been sufficiently melted and unified. When it is recognized that the thermoplastic resin has been unified, the spreading-out step is carried out to spread out the thermoplastic resin over the whole area of the surface on the one side of the wafer by the wafer. Therefore, in this forming method, pressing and spreading-out of the thermoplastic resin not having been sufficiently melted by the wafer can be restrained. In addition, pressing the thermoplastic resin not having been sufficiently melted by the wafer to damage the wafer can be restrained. Consequently, the thickness of the protective member including the thermoplastic resin formed on the surface on the one side of the wafer can be made substantially even.

The above and other objects, features and advantages of the present invention and the manner of realizing them will become more apparent, and the invention itself will best be understood from a study of the following description and an appended claim with reference to the attached drawings showing a preferred embodiment of the invention.

DETAILED DESCRIPTION OF THE PREFERRED EMBODIMENT

Figure 1:
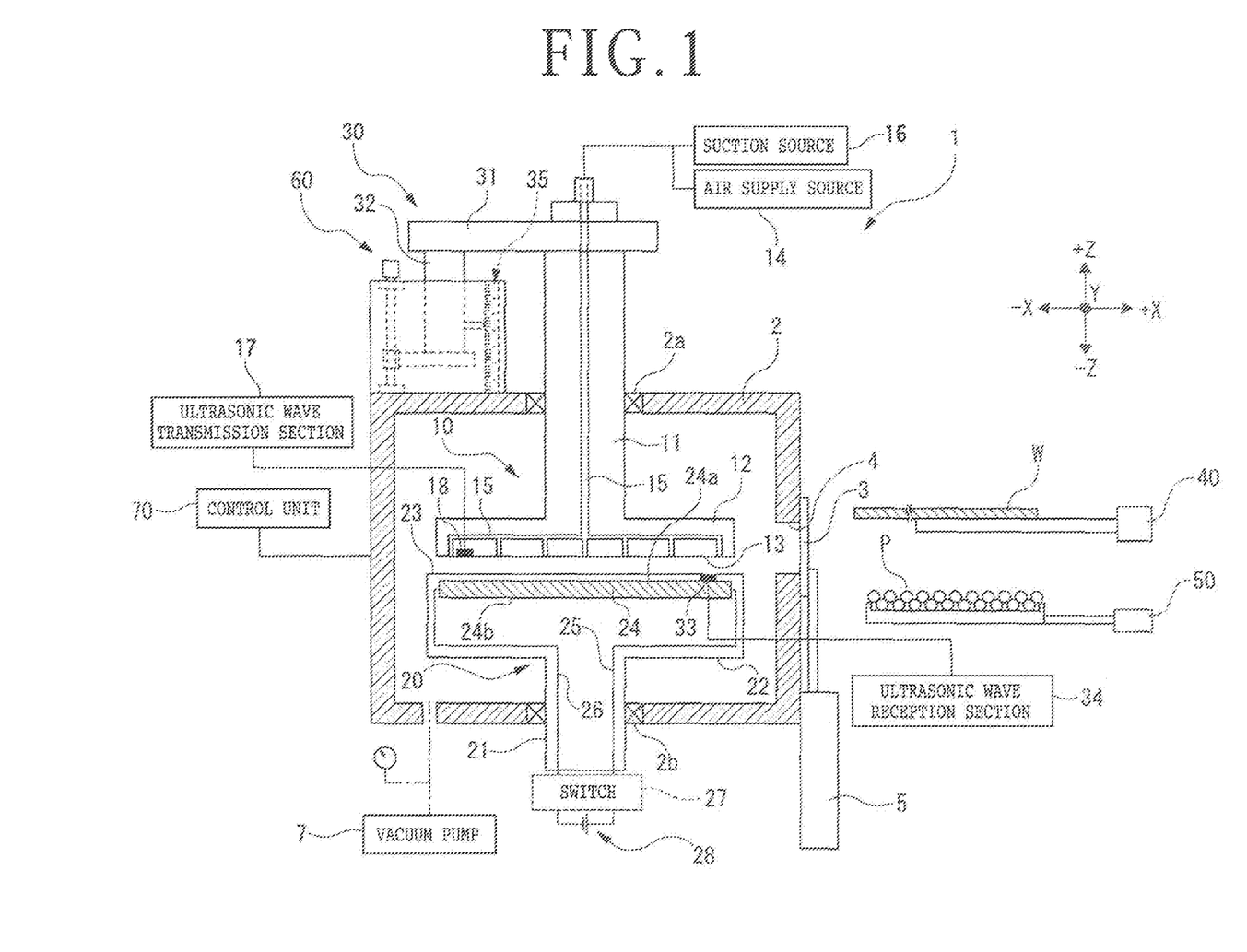
FIG. 1 is a sectional view depicting a configuration of a resin protective member forming apparatus.

A resin protective member forming apparatus 1 according to the present embodiment illustrated in FIG. 1 is for melting solid granules of a thermoplastic resin P placed on a resin placing surface 23 of a stage 20, spreading the melted thermoplastic resin P onto the whole area of a surface on one side of a wafer W, and curing the thus spread thermoplastic resin P, to form a protective member. The thermoplastic resin P is, for example, a polyolefin. The resin placing surface 23 has been subjected to, for example, fluorine coating such that it is easy to peel off the placed thermoplastic resin P.

The resin protective member forming apparatus 1 includes, in a vacuum forming chamber 2, a wafer holding unit 10 that holds the wafer W by a wafer holding surface 13, the stage 20 having the resin placing surface 23 for placing granules of the thermoplastic resin P thereon, and a vertically moving mechanism (vertically operating mechanism) 30.

The vacuum forming chamber 2 is a housing of the resin protective member forming apparatus 1 that can establish a vacuum in the inside thereof, and includes an opening 4, a cover 3 capable of covering the opening 4, a cover opening/closing mechanism 5 for opening and closing the cover 3, and a vacuum pump 7 for establishing a vacuum inside the vacuum forming chamber 2.

The wafer holding unit 10 includes a support column 11 extending while penetrating an upper surface of the vacuum forming chamber 2, and a wafer holding table 12 which is provided at a lower end of the support column 11 and is disposed inside the vacuum forming chamber 2. A lower surface of the wafer holding table 12 is the wafer holding surface 13 for suction holding the wafer W. Note that a vacuum seal 2a for maintaining the vacuum inside the vacuum forming chamber 2 is provided at a part of the upper surface of the vacuum forming chamber 2 which is penetrated by the support column 11.

The support column 11 and the wafer holding table 12 are provided therein with air passages 15 connected to an air supply source 14 and a suction source 16. The wafer holding surface 13 of the wafer holding table 12 is configured to selectively communicate with the air supply source 14 and the suction source 16 through the air passages 15. The wafer holding unit 10 is capable of suction holding the wafer W by the wafer holding surface 13 made to communicate with the suction source 16.

In addition, the wafer holding table 12 of the wafer holding unit 10 is provided with an ultrasonic wave oscillator 18 in the vicinity of the wafer holding surface 13. The ultrasonic wave oscillator 18 is connected to an ultrasonic wave transmission section 17 having, for example, a high-frequency power source. The ultrasonic wave oscillator 18 oscillates an ultrasonic wave by use of high-frequency power from the ultrasonic wave transmission section 17.

The stage 20 includes a support column 21 extending while penetrating a bottom surface of the vacuum forming chamber 2, and a resin placing table 22 which is provided at an upper end of the support column 21 and is disposed inside the vacuum forming chamber 2. Besides, an upper surface of the resin placing table 22 is the resin placing surface 23 for placing the thermoplastic resin P thereon.

The resin placing surface 23 is disposed such as to face the wafer holding surface 13 of the wafer holding unit 10. In addition, a vacuum seal 2b for maintaining the vacuum inside the vacuum forming chamber 2 is provided at a part of a bottom surface of the vacuum forming chamber 2 which is penetrated by the support column 21.

Besides, the resin placing table 22 of the stage 20 is provided with an ultrasonic wave receiver 33 in the vicinity of the resin placing surface 23. The ultrasonic wave receiver 33 receives an ultrasonic wave propagated to itself, converts the ultrasonic wave into a voltage, and transmits the voltage to an ultrasonic wave reception section 34.

In addition, the resin protective member forming apparatus 1 includes a wafer conveying mechanism 40 and a resin conveying mechanism 50. The wafer conveying mechanism 40 and the resin conveying mechanism 50 are conveying members such as robot hands. The wafer conveying mechanism 40 and the resin conveying mechanism 50 may be separate members or may be a common single member.

The wafer conveying mechanism 40 conveys the wafer W from outside into the vacuum forming chamber 2. The wafer conveying mechanism 40 is capable of positioning the wafer W at a position facing the wafer holding surface 13 of the wafer holding unit 10 in the vacuum forming chamber 2 through the opening 4. In the wafer holding unit 10, the wafer W disposed in this way can be suction held by the wafer holding surface 13 made to communicate with the suction source 16.

The resin conveying mechanism 50 conveys a plurality of granules of the thermoplastic resin P from outside to the resin protective member forming apparatus 1. The resin conveying mechanism 50 places the granules of the thermoplastic resin P on the resin placing surface 23 of the stage 20 in the vacuum forming chamber 2 through the opening 4. Note that an annular projected part may be formed at an outer periphery of the resin placing surface 23 such that the granules of the thermoplastic resin P do not drop from the resin placing surface 23.

The vertically moving mechanism 30 is disposed at an upper surface of the vacuum forming chamber 2, and is connected to the support column 11 of the wafer holding unit 10. The vertically moving mechanism 30 moves the wafer holding unit 10 and the stage 20 relatively in a Z-axis direction which is the vertical direction perpendicular to the resin placing surface 23. In the present embodiment, the vertically moving mechanism 30 moves the support column 11 of the wafer holding unit 10 in the Z-axis direction. In other words, the vertically moving mechanism 30 is configured to move the wafer holding unit 10 in the Z-axis direction relative to the stage 20 which is fixed.

Specifically, the vertically moving mechanism 30 includes an arm 31 connected to the support column 11 and extending in a horizontal direction, a driving rod 32 connected to the arm 31 and extending along the Z-axis direction, and a sensor 35 that detects a moving distance. With the driving rod 32 vertically moved by a drive source (not illustrated), the arm 31 and the wafer holding unit 10 (support column 11) connected to the arm 31 are moved vertically along the Z-axis direction. The moving distance of the wafer holding unit 10 is detected by the sensor 35.

Besides, the resin protective member forming apparatus 1 includes a load detector 60. The load detector 60 is connected to the support column 11 of the wafer holding unit 10 via the vertically moving mechanism 30. The load detector 60 detects a load exerted on the wafer holding unit 10 (that is, a force with which the wafer W presses the thermoplastic resin P) when the wafer holding unit 10 and the stage 20 make contact with each other through the wafer W and the thermoplastic resin P.

In addition, the stage 20 according to the present embodiment has a Peltier element 24 in the inside thereof. The Peltier element 24 is an example of a temperature adjustor disposed in the stage 20. The Peltier element 24 has, for example, a flat plate shape, and is disposed in the vicinity of the resin placing surface 23 of the resin placing table 22 of the stage 20, in parallel to the resin placing surface 23. The Peltier element 24 has an upper surface 24a parallel to the resin placing surface 23 and near the resin placing surface 23, and a lower surface 24b far from the resin placing surface 23.

Further, one-side ends of a first electric power line 25 and a second electric power line 26 drawn around in the support column 21 and the resin placing table 22 are attached to both ends of the Peltier element 24. The other-side ends of the first electric power line 25 and the second electric power line 26 are connected to a direct current (DC) power source 28 through switch 27.

The DC power source 28 is a power source that supplies the Peltier element 24 with a DC. The switch 27 has a function of connecting the DC power source 28 to the Peltier element 24 through the first electric power line 25 and the second electric power line 26 and a function of switching a direction of the DC flowing from the DC power source 28 to the Peltier element 24 through the first electric power line 25 and the second electric power line 26.

In other words, the switch 27 is configured such as to switch the direction of the DC supplied to the Peltier element 24 between a first direction for heating the upper surface 24a of the Peltier element 24 and a second direction, reverse to the first direction, for cooling the upper surface 24a of the Peltier element 24. Note that the lower surface 24b of the Peltier element 24 is cooled when the DC flows in the first direction and is heated when the DC flows in the second direction.

Besides, the resin protective member forming apparatus 1 includes a control unit 70 including a computer that controls members of the resin protective member forming apparatus 1. The control unit 70 controls the members of the above-mentioned resin protective member forming apparatus 1 to form a protective member on a whole area of a surface on one side of the wafer W.

Figure 2:
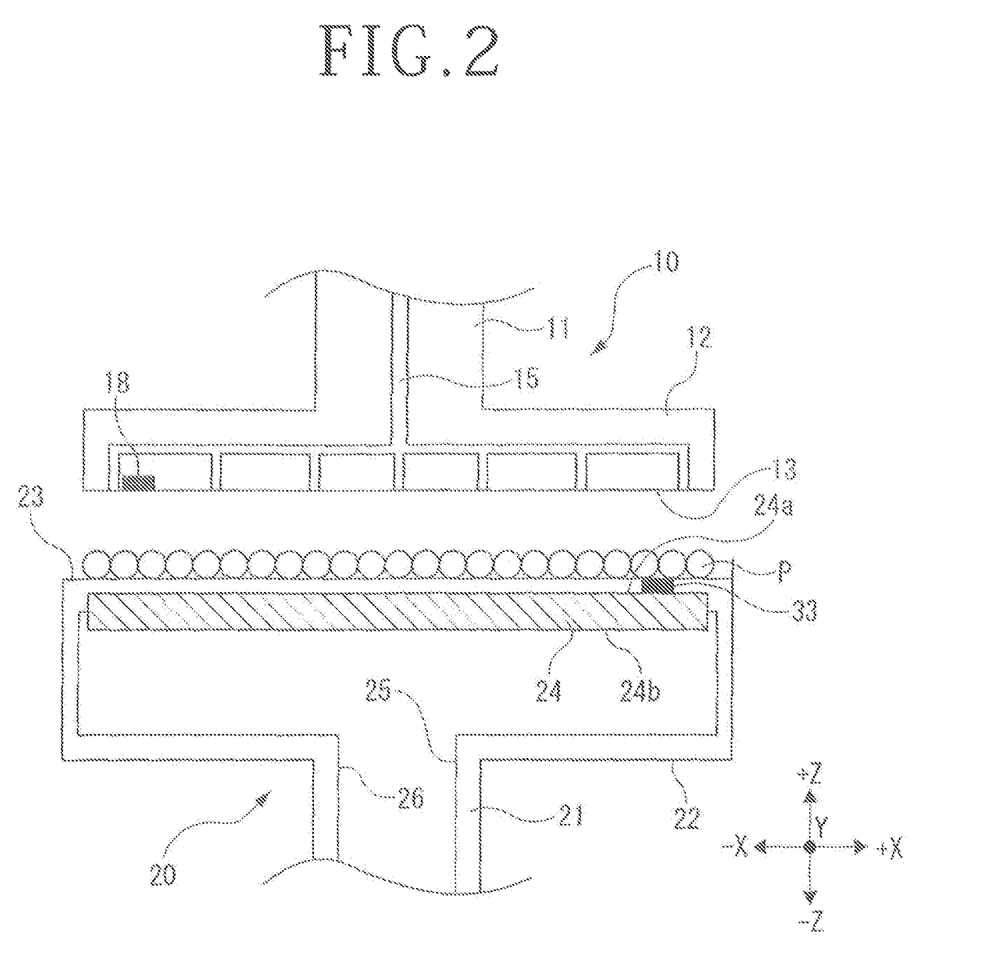
FIG. 2 is a sectional view depicting a resin supplying step performed in the resin protective member forming apparatus.

Next, an operation of forming the protective member for the wafer W in the resin protective member forming apparatus 1 will be described below. First, the control unit 70 controls the cover opening/closing mechanism 5 to open the cover 3 of the vacuum forming chamber 2, thereby exposing the opening 4. Then, the control unit 70 moves the resin conveying mechanism 50 holding the plurality of granules of the thermoplastic resin P in a −X direction, thereby conveying the thermoplastic resin P into the vacuum forming chamber 2 through the exposed opening 4. Further, the control unit 70 controls the resin conveying mechanism 50 to dispose (place) the plurality of granules of the thermoplastic resin P on the resin placing surface 23 of the stage 20, for example, in a planar form at substantially regular intervals (resin supplying step), as depicted in FIG. 2.

Figure 3:
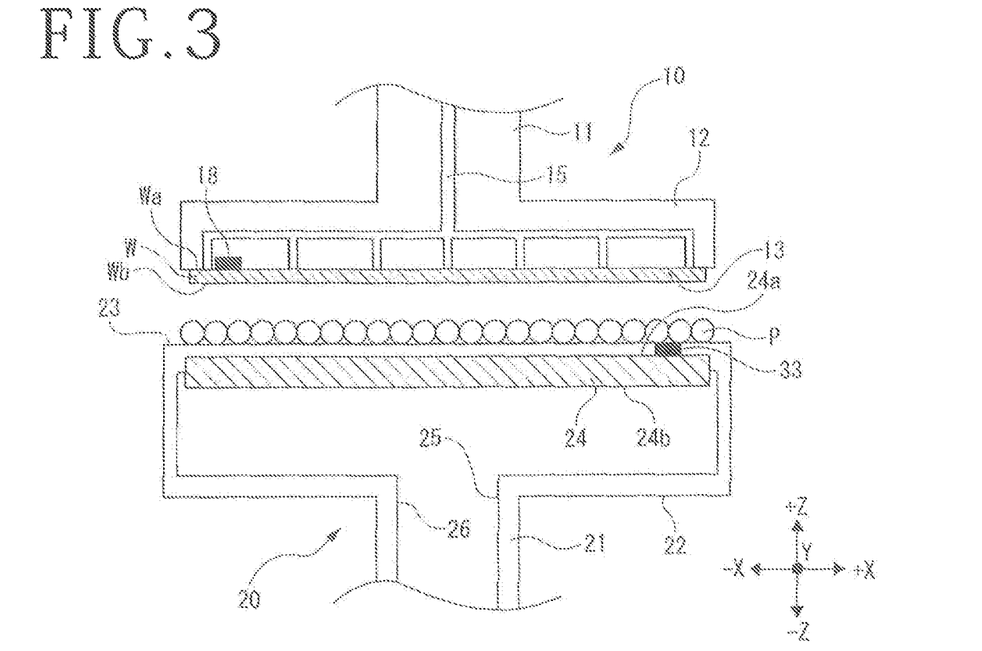
FIG. 3 is a sectional view depicting a wafer holding step performed in the resin protective member forming apparatus.

Next, the control unit 70 causes the suction source 16 depicted in FIG. 1 to communicate with the wafer holding surface 13 of the wafer holding unit 10. As a result, a negative pressure is given to the wafer holding surface 13. Further, the control unit 70 moves the wafer conveying mechanism 40 holding the wafer W in the −X direction, to thereby convey the wafer W into the vacuum forming chamber 2 via the exposed opening 4 and to position the wafer W at a position for facing the wafer holding surface 13. Furthermore, the control unit 70 suction holds a first surface (a surface on the other side) Wa of the wafer W by the wafer holding surface 13, as depicted in FIG. 3. As a result, the wafer W, in a state in which a second surface (a surface on one side) Wb is directed toward the thermoplastic resin P, is disposed on an upper side of the thermoplastic resin P placed on the resin placing surface 23 (wafer holding step).

Figure 4:
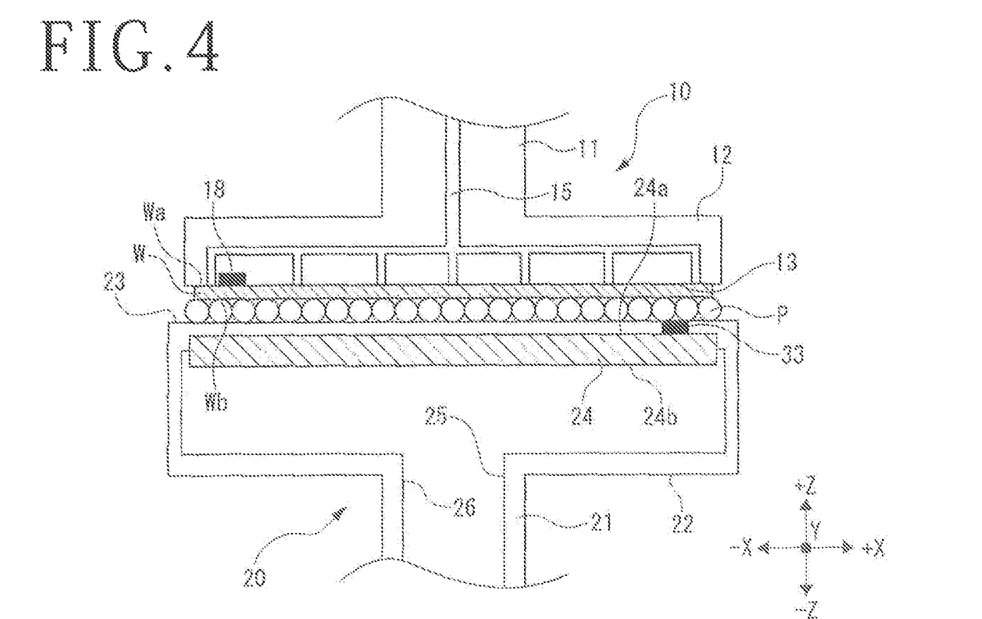
FIG. 4 is a sectional view depicting a wafer contact step performed in the resin protective member forming apparatus.

Subsequently, the control unit 70 controls the cover opening/closing mechanism 5 depicted in FIG. 1 to close the cover 3 of the vacuum forming chamber 2, thereby closing the opening 4. The control unit 70 controls the vertically moving mechanism 30 to move the wafer holding unit 10 downward along the Z-axis direction. As a result, as illustrated in FIG. 4, the second surface Wb of the wafer W held on the wafer holding surface 13 of the wafer holding unit 10 is brought into contact with the plurality of granules of the thermoplastic resin P held on the resin placing surface 23 of the stage 20 (wafer contact step).

In this way, the control unit 70 moves the wafer holding unit 10 and the stage 20 relatively in a direction for approaching each other by use of the vertically moving mechanism 30, and brings the second surface Wb of the wafer W held by the wafer holding unit 10 into contact with the granules of the thermoplastic resin P held on the resin placing surface 23 (presses the granules of the thermoplastic resin P with a comparatively weak force). In this state, the control unit 70 controls the vacuum pump 7 to establish a vacuum inside the vacuum forming chamber 2.

Further, in this state, when an air pressure inside the vacuum forming chamber 2 becomes equal to or less than a predetermined value, the control unit 70 controls the switch 27 depicted in FIG. 1 to connect the DC power source 28 to the Peltier element 24 through the first electric power line 25 and the second electric power line 26. Then, the control unit 70 controls the switch 27 to set the direction of the DC from the DC power source 28 into the first direction for heating the upper surface 24a of the Peltier element 24 as indicated by an arrow D1 in FIG. 5.

Figure 5:
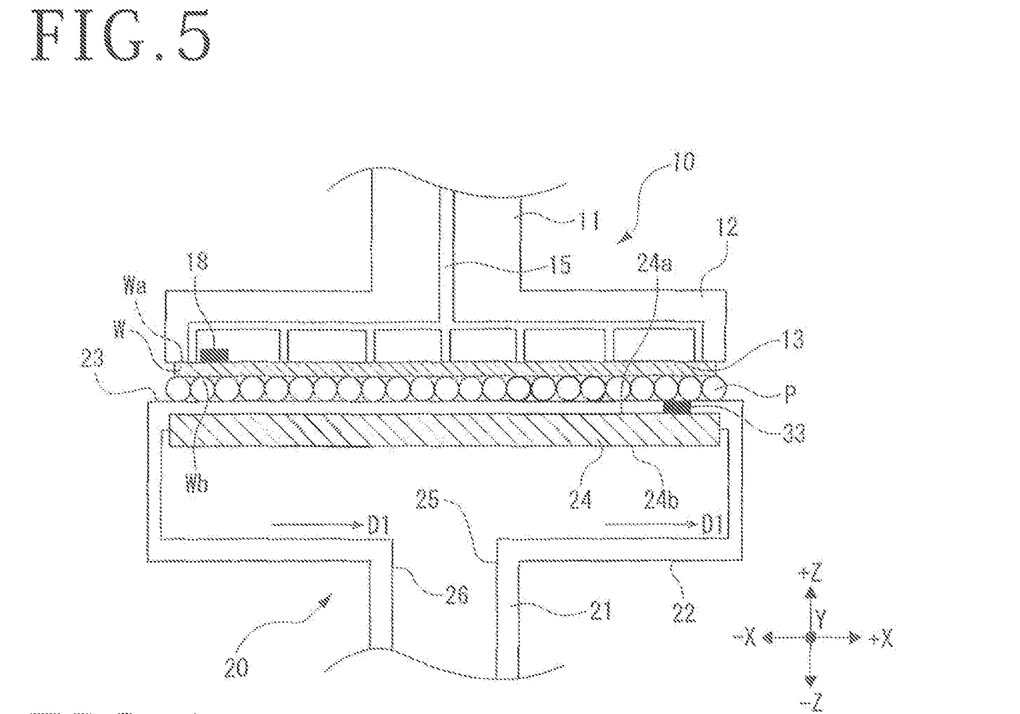
FIG. 5 is a sectional view depicting a heating step and a resin state recognizing step performed in the resin protective member forming apparatus.

In this way, the control unit 70, while pressing the thermoplastic resin P by the second surface Wb of the wafer W, causes the DC to flow in the first direction, to thereby heat the upper surface 24a of the Peltier element 24, heat the resin placing surface 23 and the thermoplastic resin P on the resin placing surface 23, and melt the thermoplastic resin P (heating step). Note that in this instance, the lower surface 24b of the Peltier element 24 is cooled.

Further, the control unit 70 controls the ultrasonic wave transmission section 17, to oscillate an ultrasonic wave from the ultrasonic wave oscillator 18. The ultrasonic wave oscillated from the ultrasonic wave oscillator 18 is propagated between the wafer holding surface 13 and the resin placing surface 23 (that is, the thermoplastic resin P). Then, the control unit 70 acquires, through the ultrasonic wave reception section 34, a voltage according to an amplitude of an ultrasonic vibration received by the ultrasonic wave receiver 33. From the voltage acquired, the control unit 70 obtains an amplitude amount of the ultrasonic vibration received by the ultrasonic wave receiver 33. Based on the amplitude amount of the ultrasonic vibration thus obtained, the control unit 70 determines whether or not the thermoplastic resin P sandwiched between the wafer holding surface 13 and the resin placing surface 23 has become a liquid and been unified (whether or not the thermoplastic resin P has been sufficiently melted) (resin state recognizing step).

Figure 6:
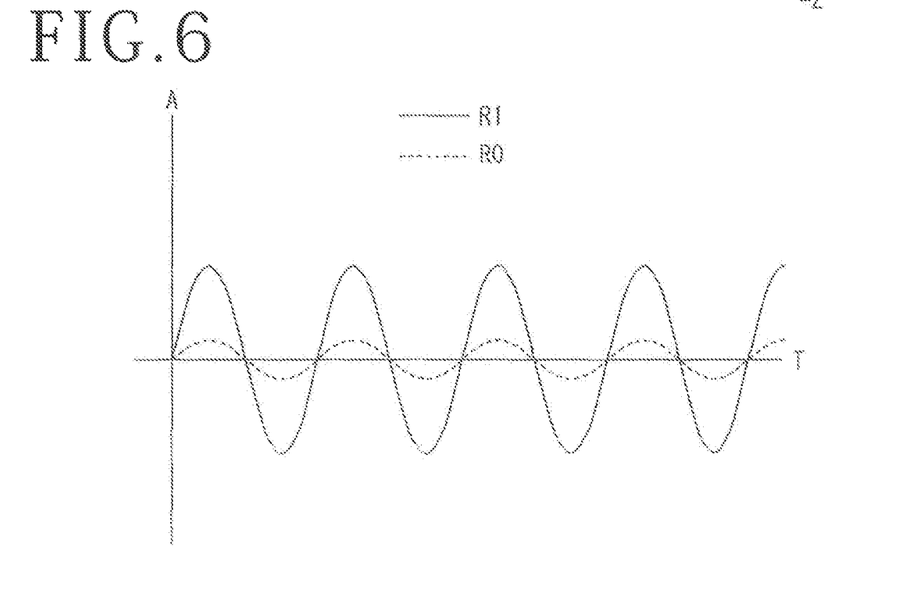
FIG. 6 is a graph depicting an example of an ultrasonic vibration received by an ultrasonic wave receiver.

FIG. 6 depicts a graph of the ultrasonic vibration received by the ultrasonic wave receiver 33. In this graph, the axis of ordinates represents the amplitude amount (A), while the axis of abscissas represents time (T). In a case where the thermoplastic resin P has not sufficiently become a liquid and has not been unified, the ultrasonic vibration received by the ultrasonic wave receiver 33 has a comparatively small amplitude, as indicated by a broken line R0 in FIG. 6. On the other hand, in a case where the thermoplastic resin P has sufficiently become a liquid and has been unified, the ultrasonic vibration received by the ultrasonic wave receiver 33 has a comparatively large amplitude, as indicated by a solid line R1 in FIG. 6.

Therefore, for example, in a case where the amplitude of the ultrasonic vibration received by the ultrasonic wave receiver 33 becomes equal to or more than a predetermined value, the control unit 70 determines that the thermoplastic resin P sandwiched between the wafer holding surface 13 and the resin placing surface 23 has been melted and unified (has been liquefied).

Figure 7:
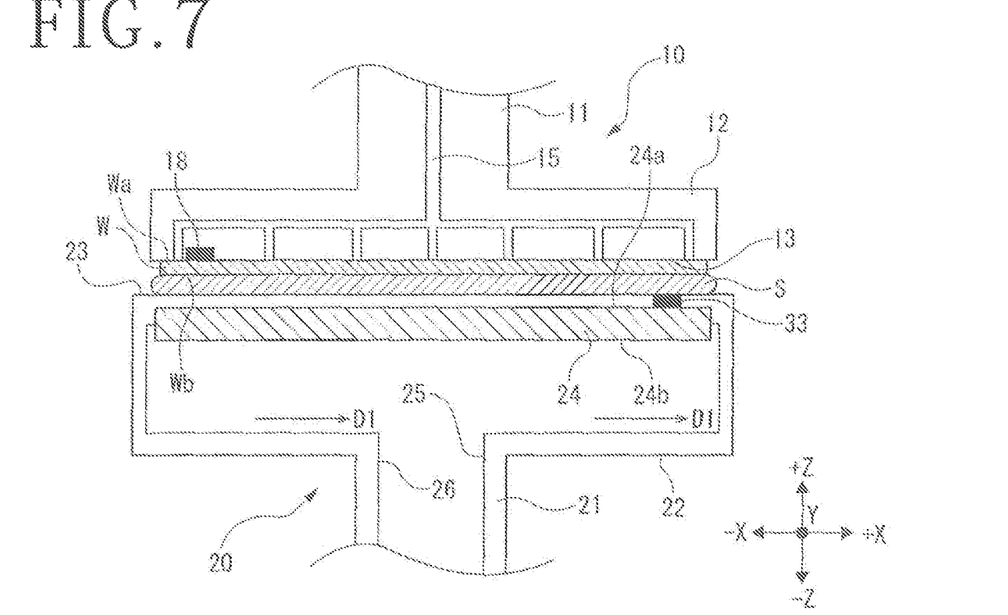
FIG. 7 is a sectional view depicting a spreading step performed in the resin protective member forming apparatus.

In a case where it is determined that the thermoplastic resin P sandwiched between the wafer holding surface 13 and the resin placing surface 23 has been melted and unified, the control unit 70 controls the vertically moving mechanism 30 to press the unified thermoplastic resin P more strongly by the second surface Wb of the wafer W. In this way, the control unit 70 spreads the unified thermoplastic resin P between the resin placing surface 23 and the second surface Wb of the wafer W onto the whole area of the second surface Wb by the wafer W. As a result, as depicted in FIG. 7, a molten resin layer S of the melted and spread thermoplastic resin P is formed such as to cover the whole area of the second surface Wb of the wafer W (spreading step).

Figure 8:
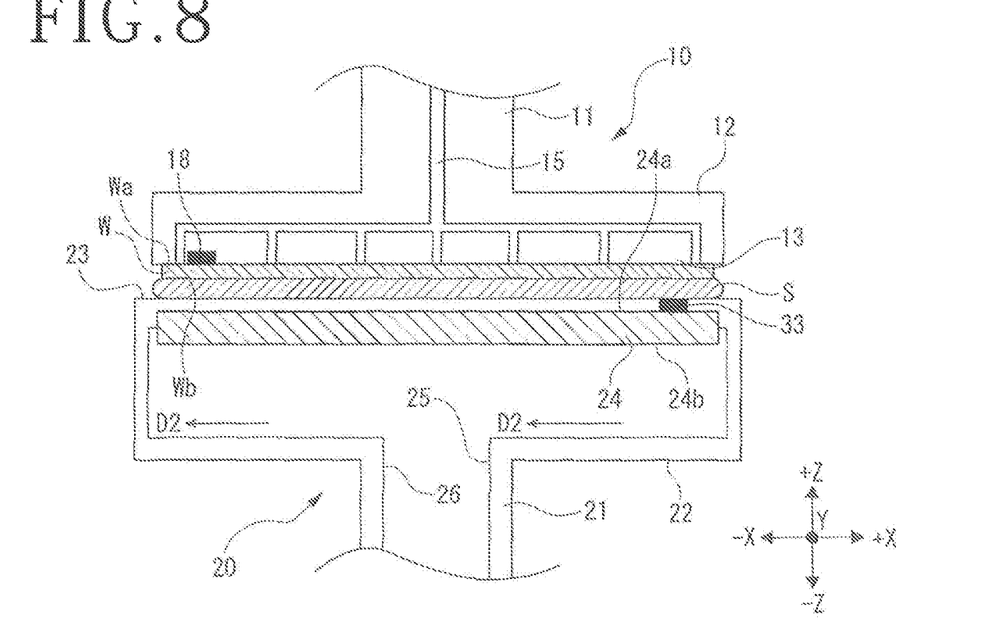
FIG. 8 is a sectional view depicting cooling (curing) performed in the resin protective member forming apparatus.

Thereafter, the control unit 70 controls the switch 27 (see FIG. 1) to cause the DC from the DC power source 28 to flow in the second direction, reverse to the first direction, for cooling the upper surface 24a of the Peltier element 24, as indicated by an arrow D2 in FIG. 8. As a result, the control unit 70, while pressing the molten resin layer S by the second surface Wb of the wafer W, cools the upper surface 24a of the Peltier element 24. By cooling the upper surface 24a in this way, the control unit 70 cools the resin placing surface 23 and the molten resin layer S on the resin placing surface 23, to thereby cure the molten resin layer S. As a result, a protective member Sa (see FIG. 9) including the cured molten resin layer S is formed on the whole area of the second surface Wb of the wafer W (cooling (curing) step). Note that in this instance, the lower surface 24b of the Peltier element 24 is heated.

Figure 9:
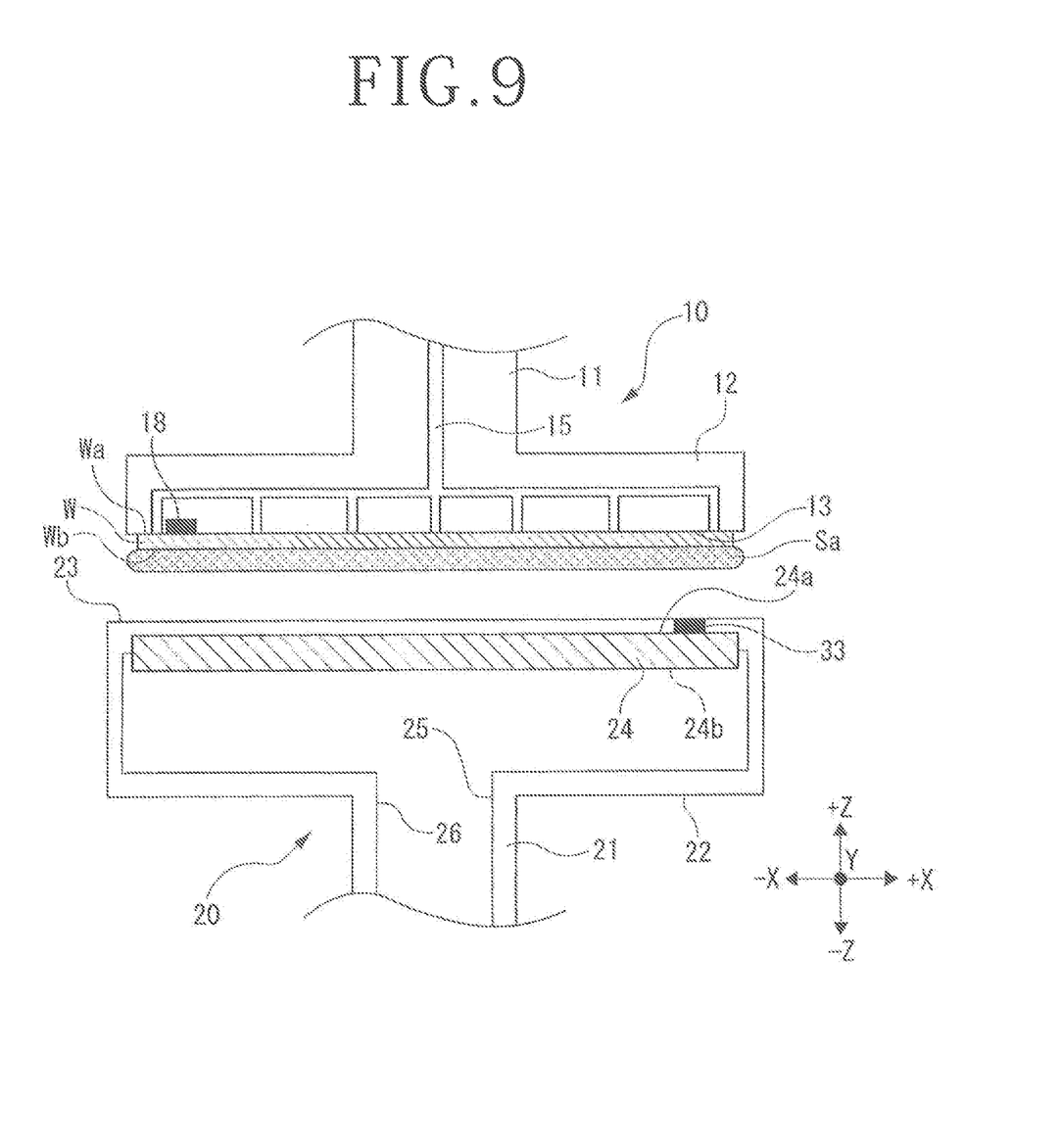
FIG. 9 is a sectional view depicting a spacing-away step performed in the resin protective member forming apparatus.

Next, the control unit 70 controls the switch 27 to cut off the DC power source 28 from the Peltier element 24. Then, the control unit 70 controls the vertically moving mechanism 30 depicted in FIG. 1 to move the wafer holding unit 10 upward along the Z-axis direction, thereby spacing away the wafer holding unit 10 from the stage 20 (resin placing surface 23) as depicted in FIG. 9. In other words, the control unit 70 spaces away the protective member Sa formed on the second surface Wb of the wafer W from the resin placing surface 23. As a result, the control unit 70 is capable of holding the wafer W formed with the protective member Sa on the second surface Wb, by the wafer holding surface 13 of the wafer holding unit 10 (spacing-away step).

Subsequently, the control unit 70 stops the vacuum pump 7 depicted in FIG. 1, and controls the cover opening/closing mechanism 5 to open the cover 3 of the vacuum forming chamber 2, thereby exposing the opening 4. As a result, the vacuum inside the vacuum forming chamber 2 is broken.

Figure 10:
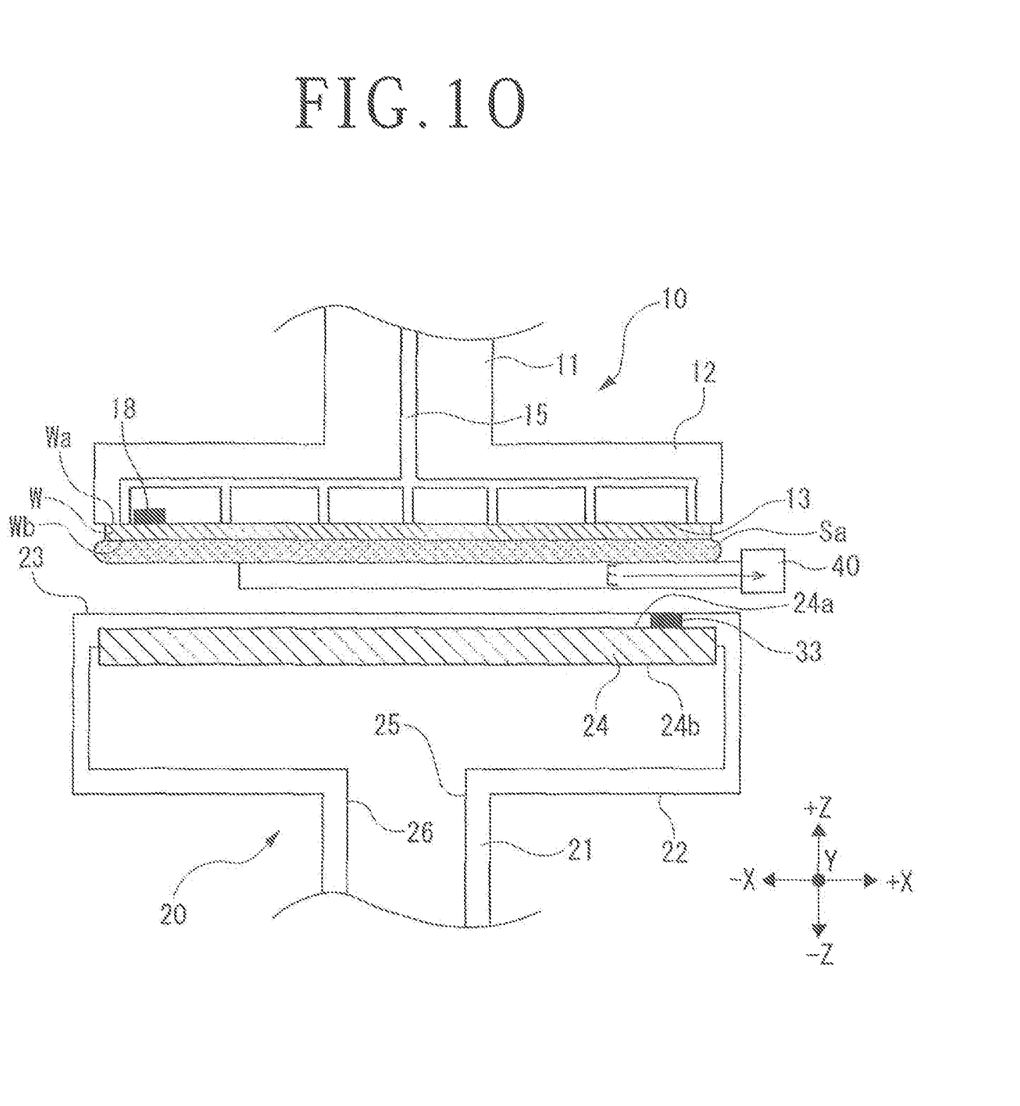
FIG. 10 is a sectional view depicting a wafer conveying-out step performed in the resin protective member forming apparatus.

Further, the control unit 70 disposes the wafer conveying mechanism 40 to face the wafer holding surface 13 of the wafer holding unit 10, and brings the wafer conveying mechanism 40 into contact with the protective member Sa covering the second surface Wb of the wafer W, as illustrated in FIG. 10. Furthermore, the control unit 70 causes the wafer holding surface 13 of the wafer holding unit 10 to communicate with the air supply source 14. As a result, the suction holding of the wafer W by the wafer holding surface 13 is released, and the wafer W is held by the wafer conveying mechanism 40.

Then, the control unit 70 moves the wafer W in a +X direction as indicated by an arrow E by the wafer conveying mechanism 40, to convey the wafer W to the outside of the vacuum forming chamber 2 via the opening 4 (wafer conveying-out step). Note that the wafer conveying mechanism 40 may hold the first surface Wa of the wafer W.

As described above, in the resin state recognizing step of the present embodiment, the ultrasonic vibration is propagated between the resin placing surface 23 and the wafer holding surface 13, whereby it is recognized whether or not the thermoplastic resin P sandwiched between the second surface Wb of the wafer W held on the wafer holding surface 13 and the resin placing surface 23 has been sufficiently melted and unified. Then, when it is recognized that the thermoplastic resin P has been unified, the spreading step is performed to spread the thermoplastic resin P onto the whole area of the second surface Wb of the wafer W by the wafer W. Therefore, in the present embodiment, spreading, by pressing with the wafer W, the thermoplastic resin P not having been sufficiently melted can be restrained. In addition, pressing, by the wafer W, the thermoplastic resin P not having been melted sufficiently and thereby damaging the wafer W can be restrained. As a result, the thickness of the protective member Sa including the thermoplastic resin P formed on the second surface Wb of the wafer W can be made substantially even.

Further, in the heating step of the present embodiment, the upper surface 24a of the Peltier element 24 is heated, whereby the resin placing surface 23 and the thermoplastic resin P placed thereon are heated, to obtain the molten resin layer S. In this instance, the lower surface 24b of the Peltier element 24 is being cooled, whereby a cooling effect in cooling the resin placing surface 23 in the cooling (curing) step which is the subsequent step can be enhanced. Therefore, the time for forming the protective member Sa on the second surface Wb of the wafer W by cooling and curing the molten resin layer S (the time for the cooling (curing) step) can be shortened.

Note that in the heating step and the cooling step of the present embodiment, the DC is made to flow through the Peltier element 24 to heat or cool the upper surface 24a of the Peltier element 24, thereby heating the granules of the thermoplastic resin P or cooling the molten resin layer S. However, the configuration for such heating and cooling is not limited to the Peltier element 24. In place of the Peltier element 24, another temperature adjusting apparatus disposed in the stage 20 or the wafer holding unit 10 may be used.

In addition, in the present embodiment, the load exerted on the wafer holding unit 10 when the wafer holding unit 10 and the stage 20 make contact with each other through the wafer W and the molten resin layer S is detected by the load detector 60 provided at the upper surface of the vacuum forming chamber 2. Such a load detector may be provided in the wafer holding table 12 of the wafer holding unit 10 or in the resin placing table 22 of the stage 20.

The present invention is not limited to the details of the above described preferred embodiment. The scope of the invention is defined by the appended claim and all changes and modifications as fall within the equivalence of the scope of the claim are therefore to be embraced by the invention.

What is claimed is:

1. A protective member forming method for forming a protective member on a surface on one side of a wafer, the protective member forming method comprising:
    a resin supplying step of disposing a plurality of granules of a thermoplastic resin on a resin placing surface of a stage;
    a wafer holding step of holding a surface on another side of the wafer by a wafer holding surface of a wafer holding unit;
    a contact step of moving the wafer holding unit and the stage relatively in a direction for approaching each other by use of a vertically moving mechanism to bring the surface on the one side of the wafer held by the wafer holding unit into contact with the granules of the thermoplastic resin;
    a resin state recognizing step of heating the granules of the thermoplastic resin in contact with the surface on the one side of the wafer while propagating an ultrasonic vibration between the resin placing surface and the wafer holding surface and recognizing whether or not the thermoplastic resin sandwiched between the surface on the one side of the wafer held on the wafer holding surface and the resin placing surface has been unified;
    a spreading-out step of spreading out the thermoplastic resin recognized to have been unified in the resin state recognizing step onto a whole area of the surface on the one side of the wafer by the wafer; and
    a curing step of cooling the thermoplastic resin spread out, to cure the thermoplastic resin,
    wherein the protective member that protects the whole area of the surface on the one side of the wafer is formed.

* * * * *